United States Patent
Vashchenko et al.

(10) Patent No.: US 7,285,805 B1
(45) Date of Patent: Oct. 23, 2007

(54) LOW REFERENCE VOLTAGE ESD PROTECTION DEVICE

(75) Inventors: Vladislav Vashchenko, Palo Alto, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/503,594

(22) Filed: Aug. 14, 2006

(51) Int. Cl.
*H01L 29/86* (2006.01)
*H01L 21/33* (2006.01)
*H02H 9/04* (2006.01)

(52) U.S. Cl. ............... 257/173; 257/175; 257/E29.325; 361/56; 438/133; 438/135

(58) Field of Classification Search ................ 257/173, 257/175; 361/56; 438/133, 135
See application file for complete search history.

(56) References Cited

U.S. PATENT DOCUMENTS

| | | | |
|---|---|---|---|
| 5,576,557 A * | 11/1996 | Ker et al. ..................... | 257/173 |
| 5,872,379 A * | 2/1999 | Lee ........................... | 257/355 |
| 6,720,624 B1 * | 4/2004 | Vashchenko et al. ....... | 257/360 |
| 6,998,651 B1 * | 2/2006 | Vashohenko et al. ....... | 257/133 |

* cited by examiner

*Primary Examiner*—Evan Pert
(74) *Attorney, Agent, or Firm*—Jurgen Vollrath

(57) ABSTRACT

In a low voltage ESD protection device, an extra control electrode is created by not connecting the n+ drain and p+ emitter regions of the LVTSCR, and controlling the control electrode by means of a diode connected NMOS.

15 Claims, 1 Drawing Sheet

LOW REFERENCE VOLTAGE ESD PROTECTION DEVICE

FIELD OF THE INVENTION

The invention relates to Electrostatic Discharge (ESD) devices. In particular it relates to an ESD protection device for low voltage I/O.

BACKGROUND OF THE INVENTION

ESD protection of I/O pins at sub-nanometer scaling becomes difficult. On the one hand, low voltage I/O cannot simply be protected by a snapback device due to the triggering voltage levels of snapback devices. On the other hand, the use of active clamp circuits (e.g. Merrill clamps that use gate control to switch on) for providing ESD protection is also difficult at the extremely low absolute maximum voltages of low voltage devices. In addition active clamps are large and use up a lot of chip area.

One approach has been to make use of diode chains where there is sufficient isolation, however the high on-state resistance and temperature coefficient makes the use of diodes unattractive for high ESD current.

The invention seeks to provide another solution to the problem of low reference voltage ESD protection.

SUMMARY OF THE INVENTION

According to the invention there is provided an ESD protection device comprising an LVTSCR with a p+ emitter formed in an n-well and defining an anode, an n+ source formed in a p-well and defining a cathode, an n+ drain formed in the n-well, and a gate, and further including a CMOS device connected to the n+ drain to provide a reference voltage to the n+ drain.

Further, according to the invention, there is provided a method of protecting a low voltage circuit, comprising providing an LVTSCR that includes a p-emitter connected to an emitter terminal, an n+ source, an n+ drain connected to a drain terminal, and a gate, the method further comprising keeping the drain terminal separate from the emitter terminal, connecting the emitter terminal to the low voltage circuit that is being protected, and connecting a reference circuit to the drain terminal for providing the drain with a reference voltage. The reference circuit may be one or more diodes, such as a CMOS diode.

DETAILED DESCRIPTION OF THE INVENTION

Figure 1:
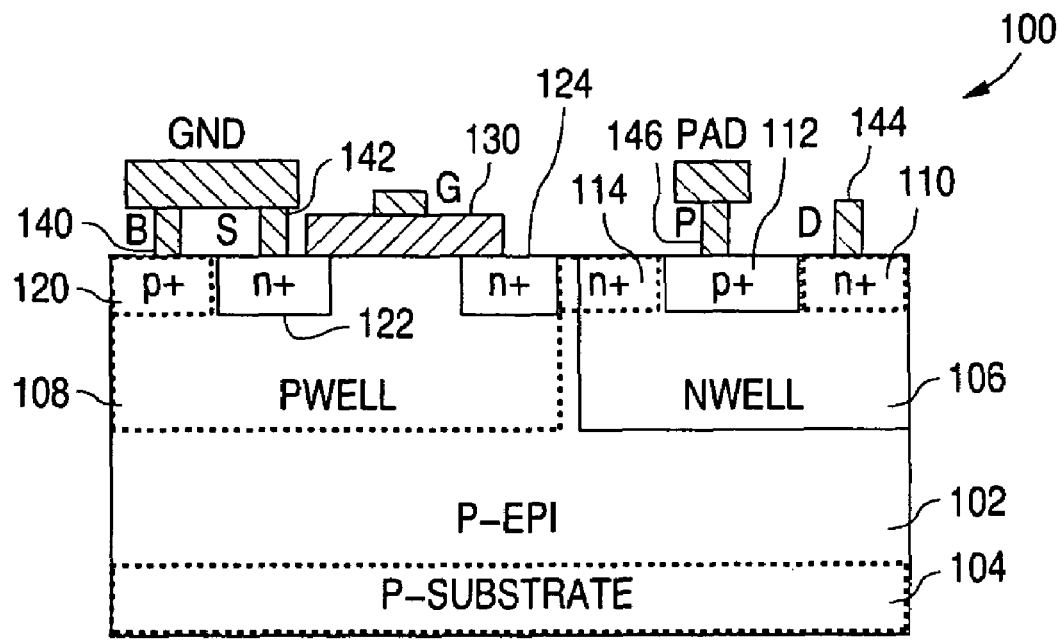
FIG. 1 is an equivalent circuit diagram of the ESD protection device of one embodiment of the invention.

FIG. 1 shows an equivalent circuit diagram of one embodiment of the invention. The LVTSCR 100 includes a p-epitaxial layer 102 grown on a p-substrate 104. An n-well 106 and a p-well 108 are formed in the epi layer 102. An n+ drain region 110, p+ emitter region 112, and an n+ region 114 are formed in the n-well 106. A p+ bulk region 120, n+ source region 122, and n+ region 124 are, in turn, formed in the n-well 108. In this embodiment the n+ region 114 extends across the n-p junction of the n-well 106 and p-well 108 as for a typical LVTSCR structure, however instead of leaving it floating it contacts the n+ region 124 which is contacted by the gate 130. As shown, the bulk contact 140 and source contact 142 are connected to each other and define the cathode. On the other hand, the drain contact 144 is not connected to the emitter contact 146. Instead, the emitter contact 146 is connected to the pad that constitutes the connection to the circuit being protected (not shown). The drain contact 144 remains separate from the emitter contact 146 and the drain region 110 is instead connected to an NMOS diode.

Figure 2:
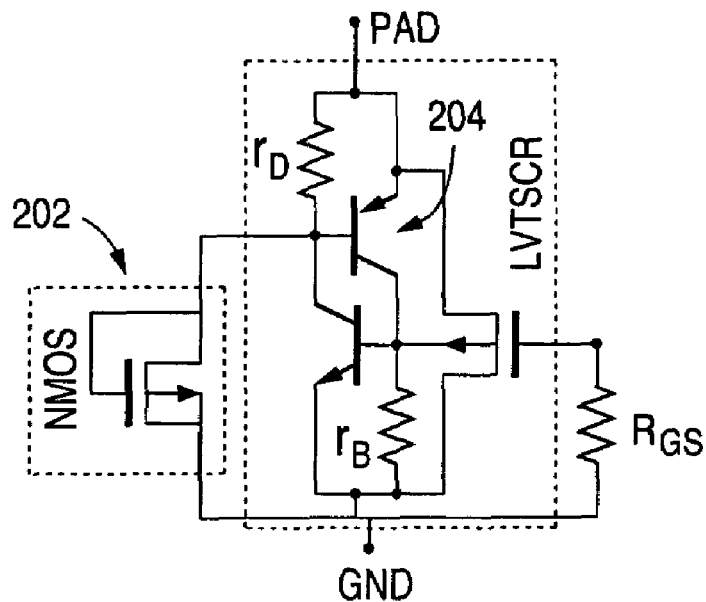
FIG. 2 is a cross-section through an ESD protection device as depicted in FIG. 1.

This is best visualized with respect to FIG. 2, which shows an equivalent circuit diagram of the structure 100. The NMOS diode is depicted as 202 in FIG. 2 and is shown connected across the control gate of the pnp transistor 204 and ground. The NMOS device 202 is formed by the n+ region 124 (which defines the drain of the NMOS device 202), by the n+ source 122, and by the gate 130 above the p-channel region (which is defined by the p-well 108). The gate 130 is connected to the contact 144 of the n+ drain 110. Since the n+ drain 110 and n+ region 114 are formed in the same n-well 106, which defines the gate of the parasitic pnp 204, the gate 130 is effectively also connected to the gate of the parasitic pnp 204 as illustrated in FIG. 2. Also, since the n+ region 114 extends to n+ region 124, the connection from the gate 130 to the n+ region 114 effectively also connects the NMOS gate 130 to its drain 124 to define a diode connected NMOS.

Also, the parasitic pnp transistor 204 is defined in FIG. 1 by the p+ emitter 112, the n-well 106 with its n+ region 114 and the p-regions of the p-substrate 104, p-epi 102, and p-well 108. Since the n+ region 124 contacts the n+ region 114, it provides the NMOS diode connection to the gate of the parasitic pnp 204. (The internal resistance of the drift blocking junction regions is shown as resistors $r_D$ and $r_B$.)

The NMOS diode 202 of the present invention is therefore a free structure (not needing additional process steps) and is formed from the source 122 and gate 130 of the LVTSCR, and merely requires that the n+ drain 110 remain separate from the p+ emitter 112, the n+ drain thereby providing an additional control electrode. The inclusion of an additional n+ region 124 formed in the p-well 108 and extending to the existing n+ region 114 of the LVTSCR helps define the NMOS gate connection to gate of the parasitic pnp. Also, by connecting the gate 130 to the n+ drain 110, the gate 130 is effectively connected to the n+ region 114 (since n+ region 110 and the n+ region 114 are formed in the same n-well 106). Therefore the NMOS is connected as a diode and provides the LVTSCR with a reference voltage to the control electrode and thereby facilitates very low turn-on without having to rely on a triggering voltage to produce avalanche breakdown. It thus produces very low voltage overstress for the I/O circuits that it protects and is ideally suited for I/O protection of modern low voltage small scale CMOS devices. While the present embodiment provides for the NMOS diode 202 to be connected to the n+ drain 110 by connecting the gate 130 to the n+ drain 110, it will be appreciated that instead gate 130 could be connected to the n+ region 114 by providing n+ region with a silicide layer for connecting to the gate 130. It will also be appreciated that the n+ region 124 could instead be silicided and connected to the gate 130 to define the NMOS diode and connect the NMOS drain to the parasitic pnp gate.

In the above embodiment a single NMOS diode was shown as the reference circuit, however other embodiments include a diode chain of multiple diodes. In a high voltage device a single diode may suffice while in low voltage devices multiple diodes may be needed.

It will be appreciated that the voltage over the one or more NMOS diodes is the same as the voltage on the p-emitter. Therefore under DC operation, while the voltage is below the triggering voltage of the multiple low voltage diodes or the high voltage diode, they remain off and the voltage on the LVTSCR control gate is not changed to turn on the LVTSCR. However, when the pulse voltage exceeds the reference voltage, the p+ emitter 112 becomes positively biased relative to the n+ drain 110. This produces forward current and the injection of holes followed by SCR turn-on. As mentioned above, no avalanche current is involved.

The present invention also has the advantage that the control circuit constitutes a supported device under the CMOS process.

While the invention was described with respect to a specific embodiment it will be appreciated that the above embodiment was given by way of example only and that the invention could be implemented in different ways without departing from the scope of the invention.

What is claimed is:

1. An ESD protection device comprising
   an LVTSCR that includes a p+ emitter and an LVTSCR n+ drain formed in an n-well, an n+ source formed in a p-well, a floating n+ region formed across the junction between the n-well and the p-well, and a gate, and
   an NMOS device connected to the n+ drain of the LVTSCR to provide a reference voltage to the n+ drain.

2. An ESD protection device of claim 1, wherein the NMOS device is connected as a diode.

3. An ESD protection device of claim 1, wherein the NMOS drain of the NMOS device is defined by an additional n+ region formed in the p-well and abutting the floating n+ region.

4. An ESD protection device of claim 1, wherein the p+ emitter and LVTSCR n+ drain formed in the n-well are provided with emitter contact and drain contact, respectively but are not connected to each other, the n+ drain contact defining a control electrode.

5. An ESD protection device of claim 1, wherein p+ emitter and LVTSCR n+ drain are provided with emitter contact and drain contact, respectively but are not connected to each other, the LVTSCR n+ drain contact defining a control electrode that is connected to the gate.

6. An ESD protection device of claim 1, wherein the floating n+ region or additional n+ region is connected to the gate.

7. An ESD protection device comprising
   an LVTSCR that includes a p+ emitter and an n+ drain formed in an n-well, an n+ source formed in a p-well, a floating n+ region formed across the junction between the n-well and the p-well, and a gate, wherein the n+ drain formed in the n-well and the p+ emitter are provided with contacts but are not connected to each other leaving the n+ drain contact as a control electrode.

8. An ESD protection device of claim 7, wherein the control electrode is controlled by a diode connected NMOS.

9. An ESD protection device of claim 8, wherein the diode connected NMOS is defined by the gate, the n+ source and an additional n+ region formed in the p-well.

10. An ESD protection device of claim 9, wherein the additional n+ region abuts the floating n+ region.

11. An ESD protection device of claim 8, wherein the NMOS is connected to the control electrode by connecting the gate to the n+ drain of the LVTSCR.

12. A method of protecting a low voltage circuit, comprising the steps of providing an LVTSCR that includes a p+ emitter and an n+ drain formed in an n-well each provided with a contact, an n+ source formed in a p-well, a floating n+ region formed across the junction between the n-well and the p-well, and a gate,
   keeping the n+ drain terminal separate from the p+ emitter contact,
   connecting the p+ emitter contact to the low voltage circuit that is being protected, and
   connecting a reference circuit to the n+ drain contact for providing the n+ drain with a reference voltage.

13. A method of claim 12, wherein the reference circuit includes one or more diodes.

14. A method of claim 13, wherein the one or more diodes comprise CMOS diodes.

15. A method of claim 14, wherein the CMOS diode is formed from the n+ source, the gate and an additional n+ region formed in the p-well.

* * * * *